United States Patent
Baccini (12)

(10) Patent No.: US 6,409,138 B1
(45) Date of Patent: Jun. 25, 2002

(54) SUPPORTING PLATE FOR FLEXIBLE BASE SUPPORTS FOR ELECTRONIC CIRCUITS

(76) Inventor: Gisulfo Baccini, Via Duca d'Aosta, 1 - 31030 Mignagola di Carbonera (TV) (IT)

( * ) Notice: Subject to any disclaimer, the term of this patent is extended or adjusted under 35 U.S.C. 154(b) by 0 days.

(21) Appl. No.: 09/538,695

(22) Filed: Mar. 30, 2000

(30) Foreign Application Priority Data

Apr. 2, 1999 (IT) .................................. UD99A0074

(51) Int. Cl.⁷ .................................................. A47B 91/00
(52) U.S. Cl. ........................ 248/346.01; 248/346.04; 248/346.02; 108/53.1; 211/49.1; 206/499; 206/821
(58) Field of Search ................ 248/346.01, 346.05, 248/346.04, 346.02; 108/53.1, 53.3, 53.5; 211/49.1, 72, 74; 206/499, 427, 701, 821

(56) References Cited

U.S. PATENT DOCUMENTS

| 4,279,204 A | * | 7/1981 | Propst ..................... 108/53.3 |
| 5,664,934 A | * | 9/1997 | Schaede et al. ............. 414/799 |
| 5,667,065 A | * | 9/1997 | Fahrion ..................... 206/599 |
| 5,685,441 A | * | 11/1997 | Calfee ....................... 211/194 |
| 5,738,487 A | * | 4/1998 | Schaede et al. ............. 414/799 |

FOREIGN PATENT DOCUMENTS

| EP | 0 030 293 A1 | 6/1981 |
| GB | 2 130 805 A | 6/1984 |
| JP | 63194187 A | 8/1988 |
| JP | 02076297 A | 3/1990 |
| JP | 10167743 A | 6/1998 |

* cited by examiner

*Primary Examiner*—Ramon O. Ramirez
*Assistant Examiner*—A. Joseph Wujciak
(74) *Attorney, Agent, or Firm*—Akin, Gump, Strauss, Hauer & Feld, L.L.P.

(57) ABSTRACT

A supporting plate (10) for flexible base supports (12) for electronic circuits is made of a rigid material and includes a plane surface (11). The flexible base supports (12) rest on the plane surface (11). The supporting plates (10) have spacers (16) protruding orthogonally from the plane surface (11) to allow another supporting plate (10) to be positioned on top of the spacers (16), stacking up without interfering with the base support (12) resting on the plane surface (11). The spacers (16) may also be used to laterally position elements of the base support (12).

5 Claims, 2 Drawing Sheets

SUPPORTING PLATE FOR FLEXIBLE BASE SUPPORTS FOR ELECTRONIC CIRCUITS

FIELD OF THE INVENTION

This invention concerns a supporting plate for flexible base supports for electronic circuits, particularly for base supports made with very thin sheets of alumina and plastic materials, commonly known as "green-tape".

The plate according to the invention is able to support the sheets of green-tape so as to be able to move them and stack them up, keeping them flat and horizontal, during the different working stages of a device which is able to perform three different operations: to deposit the conductor material by means of serigraphy to embody the conductor tracks, the drying operation in the oven, and also the cooling operation.

BACKGROUND OF THE INVENTION

One of the techniques well-known in the production of electronic circuits is to use as a base support one or more sheets of insulating material, consisting of alumina or synthetic materials, according to the green-tape technology.

In conventional appliances, the green-tape supports are normally arranged one in front of the other on rectilinear guides along which they are made to advance in sequence, by means of a feed mechanism, from a loading station to a printing station where, by means of serigraphy, the conductor material is deposited thereon, in the form of a conductor paste, according to a pre-defined mask. Subsequently, each support is introduced into a drying oven, at a temperature of at least 120° C. for the time needed to make the conductor paste set.

After they have been dried in the oven, the supports are cooled in a suitable cooling chamber.

Normally therefore, the green-tape supports cannot be stacked up one on top of the other, since the conductor paste cannot be touched by anything before it is permanently fixed to the underlying base support.

It is for this reason that conventional devices have the disadvantage of being very bulky, with a linear development of several tens of metres. This depends on the fact that all the steps described above occur in serial sequence, with the base supports always kept one next to the other on the same horizontal plane.

The present Applicant has devised and embodied the supporting plate for flexible base supports for electronic circuit according to the invention to overcome these shortcomings.

SUMMARY OF THE INVENTION

The supporting plate for flexible base supports for electronic circuits according to the invention is set forth and characterized in the main claim, while the dependent claims describe other innovative features of the invention.

One purpose of the invention is to achieve a supporting plate for flexible base supports for electronic circuits which will be rigid and stackable, so that the base supports resting thereon can be stacked up too.

Another purpose of the invention is to achieve a supporting plate which will allow to support flexible base supports of different sizes and that the latter can easily be positioned with respect to the plate itself to be subjected to subsequent operations, that is, depositing the conductor paste, drying and cooling.

In accordance with these purposes, the supporting plate according to the invention is made of rigid material, comprises a plane supporting surface for the flexible base supports and is provided with spacer elements protruding orthogonally from the plane surface to allow another supporting plate to be placed on top, stacking up without interfering with the base support resting on the plane surface.

According to another characteristic of the invention, the plate according to the invention is provided with a first plurality of holes into which the spacer elements can be removably inserted.

According to another characteristic of the invention, the first plurality of holes is made in a zone near the edges of the plane surface, where the base support does not rest.

According to another characteristic of the invention, the plate comprises a second plurality of through holes, made in a pattern of lines and columns, into which further spacers are able to be removably inserted, to function as lateral positioning elements of the base support, according to the size thereof.

BRIEF DESCRIPTION OF THE DRAWINGS

These and other characteristics of the invention will become clear from the following description of a preferential form of embodiment, given as a non-restrictive example, with reference to the attached drawings wherein.

DETAILED DESCRIPTION OF PREFERRED EMBODIMENT

Figure 1:
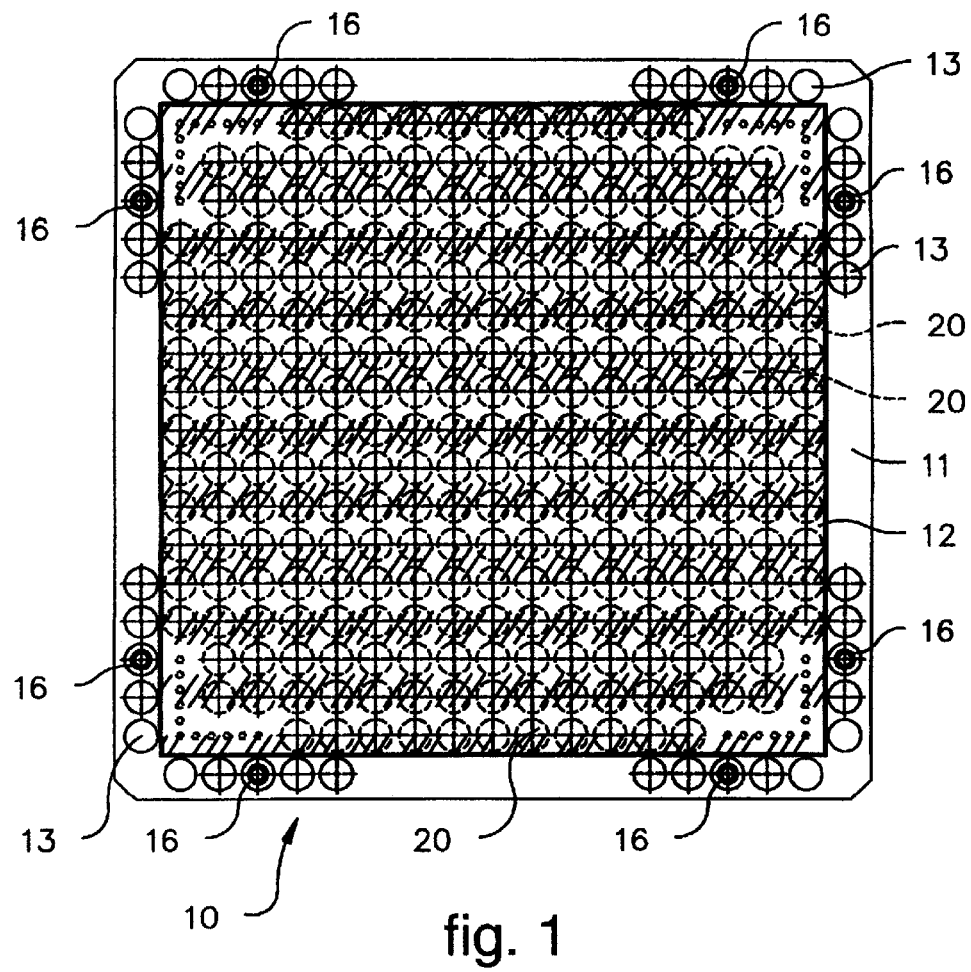
FIG. 1 is a plane view of a supporting plate for flexible base supports for electronic circuits according to the invention.
Figure 2:
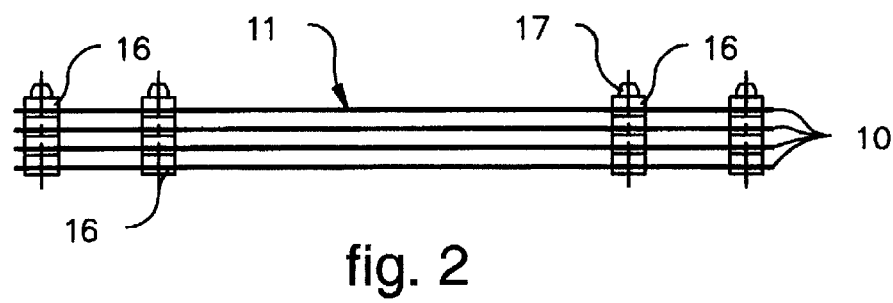
FIG. 2 is a side view of some plates from FIG. 1, stacked on top of each other.

With reference to FIG. 1, a supporting plate 10 according to the invention is made of rigid material, for example aluminium, is substantially parallelepiped in shape and has a plane upper surface 11 on which a base support 12 is able to rest, of the flexible type for printed circuits. The plate 10 is about one millimeter thick.

Each base support 12 consists, for example, of one or more flexible, very thin sheets, in the region of some tenths of a millimeter thick, made of insulating material, such as alumina or plastic material, obtained using the green-tape technology.

Normally each support 12 is regular in shape, square or rectangular, and of a standard size for the electronics industry, usually expressed in inches, for example 4"×4", 6"×6", 8"×8" or 11"×11". To give an example, FIG. 1 shows a square support 12, which is resting on a plate 10 which is also square.

It is obvious that the plate 10 can be of any other shape and that supports 12 of any other shape and size whatsoever may be rested on the plate 10 according to the invention, it being understood that, in every case, at least one of the dimensions of the plate 10 (length or width) must be greater than those of the support 12 which is to be supported.

According to one characteristic of the invention, the plates 10 are able to be stacked up one on top of the other, without the supports 12 supported thereby touching each other.

The plate 10 is provided with a first series of through holes 13 arranged in alignment and in proximity with the edges, into which spacers 16 are able to be removably inserted; the spacers are made of synthetic material, for example polyamide, and are made by molding.

Figure 3:
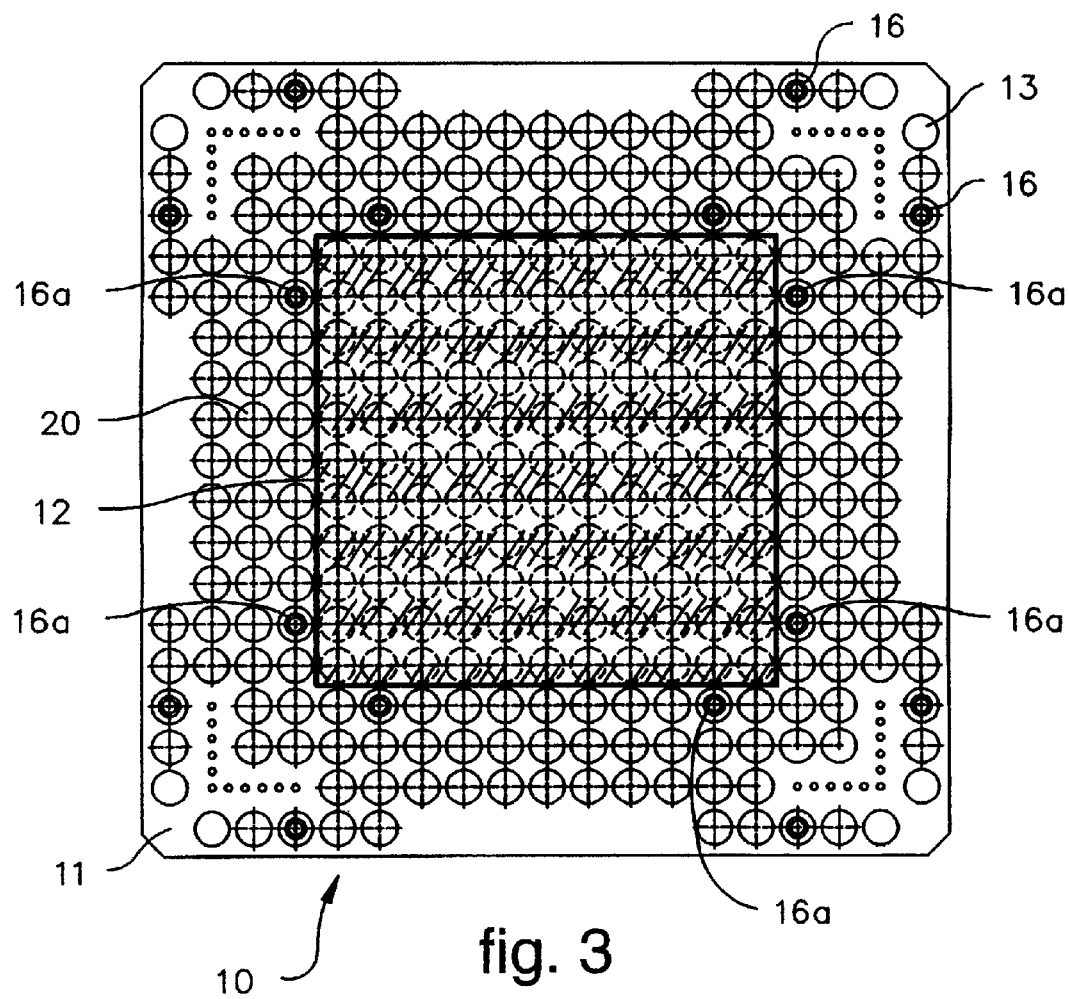
FIG. 3 is an enlarged detail of FIG. 2.

Each spacer 16 (FIG. 3) is shaped so as to comprise a substantially cylindrical central body, a central pin 17, with the upper end shaped like a truncated cone, and a corresponding lower cavity 18. In order to be stable with respect to the plate 10, each spacer 16 is provided with a circumferential groove 19.

Each spacer 16 is able to precisely couple, in a male-female coupling, with a spacer above or below.

It is therefore clear that, by means of the spacers 16 inserted in the holes 13, the plates 10 can easily be stacked, one on top of the other, without the supports 12 resting on the surfaces 11 being touched.

Once they have been stacked, the distance D between two adjacent plates 10 is a few millimeters, sufficient to allow the supports 12 to be lapped by a flow of hot and cold air, during the drying and respectively the cooling steps, so that each of the two working steps may be carried out simultaneously for several supports 12.

It is therefore easy to achieve stacks of more than 40 plates, and relative supports 12, one on top of the other, to move them together and, above all, to dry and cool all the supports 12 of the stack together.

The plate 10 is also provided with a second series of through holes 20, arranged in a pattern of lines and columns, into which spacers 16 are able to be removably inserted, to function as lateral positioning elements of the support 12, according to the size of the latter.

In fact, if the support 12 were smaller than the maximum size allowed by the supporting surface 11, it could move from one side to the other, along said surface, during the movement of the plate 10.

Figure 4:
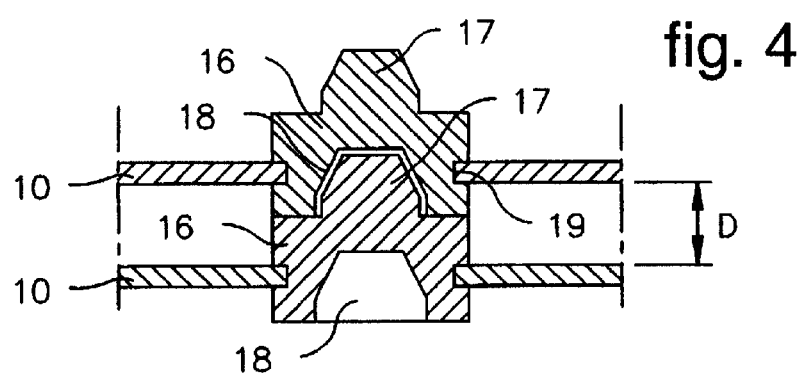
FIG. 4 is a plane view of the supporting plate shown in FIG. 1 on which a different base support is mounted.

By inserting additional spacers, indicated by 16a in FIG. 4, into the holes 20 in positions chosen according to the shape and size of the support 12 to be treated, the support is kept in the desired position.

It is obvious that modifications and additions can be made to the supporting plate 10 for flexible base supports for electronic circuits as described heretofore, but these shall remain within the field and scope of this invention.

What is claimed is:

1. A supporting plate for flexible base supports (12) for electronic circuits, the plate being characterized in that it is made of rigid material and comprises:

(a) a plane surface (11) on which said flexible base supports (12) rest;

(b) a first plurality of holes (13) provided in a peripheral zone of the plane surface (11) between edges of the flexible base support (12) and edges of the plate to define within the peripheral zone a maximum area wherein the flexible base supports (12) can be disposed; and (c) at least one spacer element (16) protruding orthogonally from said plane surface (11) to allow another supporting plate (10) to be positioned on top of the at least one spacer (16), stacking up without interfering with the base support (12) resting on said plane surface (11) wherein each spacer element (16) is shaped to be elastically insertable, in a removable manner in any of the first plurality of holes (13) and includes an upper pin (17) and a corresponding lower cavity (18).

2. The plate as in claim 1, characterized in that said upper pin (17) has its upper end shaped like a truncated cone and is able to couple precisely, in a male-female coupling, with the corresponding lower cavity (18) of a spacer element (16) of a plate (10) thereabove.

3. The plate as in claim 1, characterized in that a second plurality of through holes (20) is made in a pattern of lines and columns, and that in said second plurality of through holes (20) further spacers (16a) are able to be removably inserted, to function as lateral positioning elements of said base support (12), according to the size of the latter.

4. The plate as in claim 1, characterized in that said rigid material is aluminum, substantially square in shape and about one millimeter thick.

5. A supporting plate for flexible base supports (12) to comprises:

(a) a plane surface (11) on which said flexible base supports (12) rest;

(b) a first plurality of holes (13) provided in a peripheral zone of the plane surface (11) between edges of the flexible base support (12) and edges of the plate to define within the peripheral zone a maximum area wherein the flexible base supports (12) can be disposed; and (c) at least one spacer element (16) protruding orthogonally from said plane surface (11) to allow another supporting plate (10) to be positioned on top of the at least one spacer (16), stacking up without interfering with the base support (12) resting on said plane surface (11) wherein each spacer element (16) is shaped to be elastically insertable, in a removable manner in any of the first plurality of holes (13) and includes a circumferential groove (19) able to cooperate with the inner wall of the corresponding hole (13) into which it is inserted.

\* \* \* \* \*